United States Patent [19]

Mochizuki et al.

[11] Patent Number: 5,433,788
[45] Date of Patent: Jul. 18, 1995

[54] APPARATUS FOR PLASMA TREATMENT USING ELECTRON CYCLOTRON RESONANCE

[75] Inventors: Yasuhiro Mochizuki, Katsuta; Naohiro Momma, Hitachi; Shigeru Takahashi, Hitachiota; Takuya Fukuda; Noboru Suzuki, both of Hitachi; Tadasi Sonobe, Iwaki; Kiyoshi Chiba; Kazuo Suzuki, both of Hitachi, all of Japan

[73] Assignees: Hitachi, Ltd., Tokyo; Hitachi Service Engineering Co., Ltd., Hitachi, both of Japan

[21] Appl. No.: 131,519

[22] Filed: Oct. 4, 1993

Related U.S. Application Data

[63] Continuation of Ser. No. 671,661, Mar. 19, 1991, abandoned, which is a continuation of Ser. No. 191,036, May 6, 1988, abandoned, which is a continuation-in-part of Ser. No. 145,371, Jan. 19, 1988, Pat. No. 4,876,983.

[30] Foreign Application Priority Data

May 8, 1987 [JP] Japan .................. 62-110752
Jun. 2, 1987 [JP] Japan .................. 62-138772
Sep. 3, 1987 [JP] Japan .................. 62-219179

[51] Int. Cl.6 ............................................ C23C 16/50
[52] U.S. Cl. .................. 118/723 MR; 118/723 MA; 427/571; 427/575
[58] Field of Search ............... 118/723 MR, 723 MA; 427/571, 575; 156/345, 643

[56] References Cited

U.S. PATENT DOCUMENTS

| | | | |
|---|---|---|---|
| 4,401,054 | 8/1983 | Matsuo et al. ............... | 118/723 |
| 4,438,368 | 3/1984 | Abe et al. .................... | 118/723 MR |
| 4,512,867 | 4/1985 | Andreev et al. ............... | 118/723 |
| 4,532,199 | 7/1985 | Ueno .......................... | 427/39 |
| 4,559,100 | 12/1985 | Ninomiya et al. ............. | 156/345 |
| 4,585,541 | 4/1986 | Miyake et al. ............... | 118/723 MR |
| 4,673,586 | 6/1987 | White ......................... | 427/38 |
| 4,683,838 | 8/1987 | Kimura et al. ............... | 118/715 |
| 4,727,293 | 2/1988 | Asmussen et al. ............. | 118/723 |
| 4,776,918 | 10/1988 | Otsubo et al. ................ | 118/728 |
| 5,275,798 | 1/1994 | Aida ........................... | 427/571 |

FOREIGN PATENT DOCUMENTS

| | | | |
|---|---|---|---|
| 0171949 | 2/1986 | European Pat. Off. . | |
| 3144016 | 7/1982 | Germany ............... | 118/723 MR |
| 56-155535 | 12/1981 | Japan . | |
| 57-79621 | 5/1982 | Japan . | |
| 57-167631 | 10/1982 | Japan ................... | 118/723 |
| 57-177975 | 11/1982 | Japan . | |
| 58-125820 | 7/1983 | Japan . | |
| 59-136130 | 8/1984 | Japan . | |
| 60-103098 | 6/1985 | Japan . | |
| 60-202942 | 10/1985 | Japan ................... | 427/571 |
| 61-135126 | 6/1986 | Japan ................... | 118/723 |
| 61-150219 | 7/1986 | Japan . | |
| 61-166975 | 7/1986 | Japan ................... | 427/45.1 |
| 61-183463 | 8/1986 | Japan ................... | 118/723 |
| 61-213377 | 9/1986 | Japan ................... | 118/723 |
| 62-096397 | 5/1987 | Japan . | |
| 62-103370 | 5/1987 | Japan ................... | 118/723 |
| 62-115821 | 5/1987 | Japan ................... | 118/723 |
| 62-150726 | 7/1987 | Japan ................... | 118/723 |
| 62-54419 | 11/1987 | Japan ................... | 118/723 |
| 62-287072 | 12/1987 | Japan ................... | 118/723 |
| 2163458 | 2/1986 | United Kingdom ...... | 118/50.1 |

OTHER PUBLICATIONS

Karr, P.C., "Vacuum Deposition of Material Films on Substrates Utilizing Controlled Plasma," IBM Technical Disclosure Bulletin, vol. 19, No. 5 (Oct. 1976) pp. 1518–1520.

*Primary Examiner*—Terry J. Owens
*Attorney, Agent, or Firm*—Kenyon & Kenyon

[57] ABSTRACT

A plasma treatment apparatus for forming a thin film on a substrate in a vacuum vessel includes a magnetic field generator which can be positioned inside or outside the vacuum vessel, and a microwave source. The magnetic field strength is controllable such that an electron cyclotron resonance (ECR) area is defined near the substrate. The magnetic field generator can be arranged so that plasma and reactive gas introduction ports are on the microwave introduction side of the ECR area and the substrate is on the opposite side of the ECR area. Alternatively, a gas introduction port can be positioned such that reactive gas is introduced into the ECR area or onto the substrate.

23 Claims, 9 Drawing Sheets

APPARATUS FOR PLASMA TREATMENT USING ELECTRON CYCLOTRON RESONANCE

CROSS REFERENCE TO RELATED APPLICATIONS

This application is a continuation of application Ser. No. 07/671,661, filed on Mar. 19, 1991, now abandoned, which is a continuation of application Ser. No. 07/191,036, filed on May 6, 1988, now abandoned, which is a continuation-in-part of application Ser. No. 07/145,371, filed on Jan. 19, 1988 and issued as U.S. Pat. No. 4,876,983 on Oct. 31, 1989.

BACKGROUND OF THE INVENTION

The present invention relates to a plasma treatment apparatus used for depositing a desired substance on a substrate to form a thin film.

A method of forming a thin film on a predetermined substrate is used in many fields of the art, for example, in the fabrication process of a semiconductor integrated circuit. Generally, a thin film is formed in an atmosphere of high temperature. When fabricating a semiconductor integrated circuit, however, sometimes a thin film is formed on a semiconductor integrated circuit which has been fabricated. (In this case, the semiconductor integrated circuit corresponds to the above-mentioned substrate.) When the thin film is formed on such a semiconductor integrated circuit, a fear that the semiconductor integrated circuit will be negatively influenced if the formation of the thin film is conducted in an atmosphere of high temperature exists. This problem is not limited to the semiconductor integrated circuit but is common to any substrate affected by the high temperatures. In recent years, a microwave plasma treatment apparatus has been proposed as means for solving such a problem. The microwave plasma treatment apparatus will be explained by virtue of FIG. 1A and 1B.

Figure 1A:
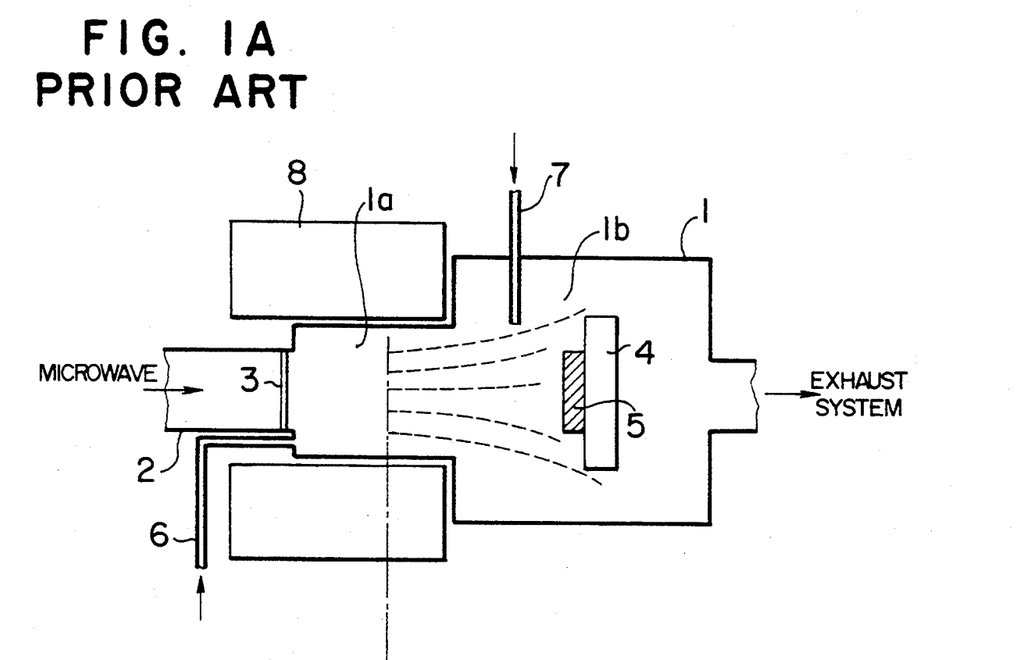
FIG. 1A is a schematic view of one example of a conventional microwave treatment apparatus and FIG. 1B illustrates the distribution of magnetic field strengths in the apparatus.
Figure 1B:
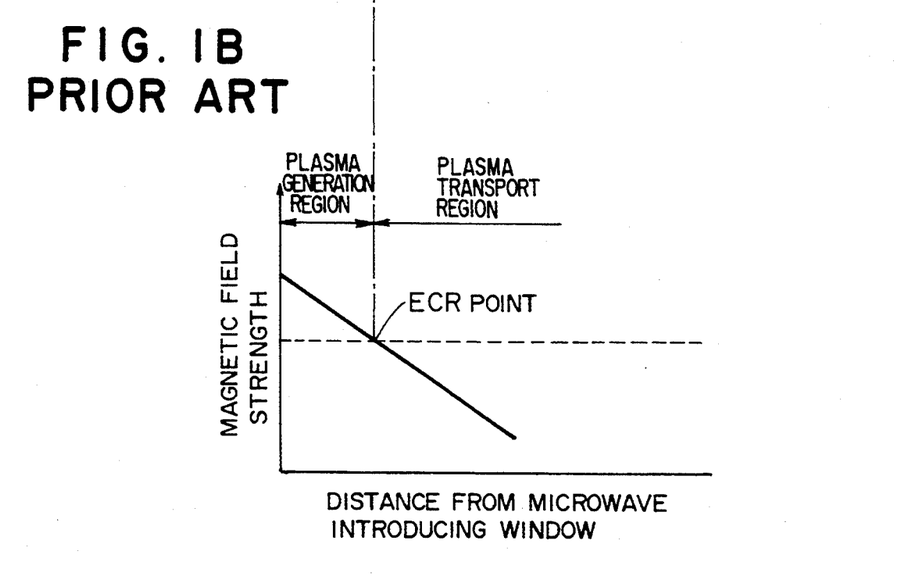

FIG. 1A shows a schematic view of the conventional microwave plasma treatment apparatus and in FIG. 1B shows the distribution of strengths of a magnetic field in the apparatus shown in FIG. 1A. One example of the shown conventional microwave plasma treatment apparatus has been disclosed by U.S. Pat. No. 4,401,054. In FIG. 1A, reference numeral 1 designates a vacuum vessel which is evacuated or exhausted by means of a vacuum pump not shown. Numeral 1a designates a discharge section in the vacuum vessel 1, and numeral 1b a reaction section in the vacuum vessel 1. Numeral 2 designates a waveguide for guiding a microwave emitted from a magnetron not shown, and numeral 3 a microwave introducing window made of an insulating material such as quartz for introducing the guided microwave into the vacuum vessel 1. Numeral 4 designates a supporting plate (or holder) provided at the reaction section 1b, and numeral 5 a substrate which is supported on the supporting plate 4 and on which a thin film is to be formed. Numeral 6 designates a first gas conduit for introducing a first predetermined gas into the discharge section 1a, and numeral 7 a second gas conduit for introducing a second predetermined gas into the reaction section 1b. Numeral 8 designates an electromagnetic coil wound around the vacuum vessel 1 for producing in the vacuum vessel 1 a magnetic field as shown in FIG. 1B.

The operation of the above-mentioned microwave plasma treatment apparatus will now be explained referring to the magnetic field strength distribution shown in FIG. 1B. In FIG. 1B, the abscissa represents a distance in the vacuum vessel 1 from the microwave introducing window 3 and the ordinate represents the strength of the magnetic field produced by the electromagnetic coil 8.

After the vacuum vessel 1 has been evacuated to a pressure not higher than $10^{-6}$ Torr, a predetermined gas, for example, an oxygen gas is introduced at a predetermined pressure from the gas conduit 6 while a microwave is introduced from the microwave introducing window 3, so that a plasma of oxygen gas is produced. At this time, if a magnetic field having a predetermined strength is applied by the electromagnetic coil 8, electrons in the plasma make their circular motions by a Lorentz'force and impinge against non-ionized oxygen molecules which in turn are ionized to release electrons therefrom. In this manner, the ionization of the oxygen gas progresses at a rapid speed through the motions of electrons, thereby generating a plasma of oxygen gas at a high density in the discharge section 1a.

The above-mentioned motions (circular motions) of electrons do not occur under the mere existence of the microwave and the magnetic field but are generated through a resonance phenomenon produced only when a specified magnetic field exists for a specified microwave. Namely, when the introduced microwave has a frequency of 2.45 GHz, the circular motions of electrons take place at a point wherein the strength of the magnetic field is 875 Gauss. Since in FIG. 1B the level of 875 Gauss is represented by broken line and the magnetic field strength distribution in the vacuum vessel 1 is represented by solid line, a point of occurrence of the circular motions of electrons is on a line indicated by one-dotted chain line. Such a point is called an electron cyclotron resonance (ECR) point. A region on the side of the ECR point near the microwave introducing window 3 is called a plasma generation region. The ECR point can also be called an ECR portion since it may have a plane-like or three-dimensional extent.

The plasma thus generated moves toward the reaction section 1b since the evacuation is made. This movement of the plasma is due to the evacuation and since electron ions of positive charges are attracted by a group of electrons of negative charges which have moved through the circular motions thereof. A region on the side of the ECR point near the substrate 5 is called as a plasma transport region. If a predetermined gas, for example, a monosilane gas ($SiH_4$) is introduced from the gas conduit 7 into the reaction section 1b when the plasma is moving, the monosilane gas impinges against the transported plasma so that the monosilane gas is activated and reacts on the oxygen gas to produce a silicon oxide ($SiO_2$) which is then deposited on the substrate 5. Thus, a thin film of silicon oxide is formed on the substrate 5.

The thin film formed on the substrate 5 is base on the gases introduced from the conduits 6 and 7.

The above-mentioned microwave plasma treatment apparatus is remarkably excellent where forming a thin film on a substrate liable to be affected by high temperature is desired. However, the efficiency of reaction of a gas as a main raw material introduced from the gas conduit 7 or the rate of deposition of a substance deposited on the substrate 5 and the quality of a thin film formed has not been sufficiently considered.

Figure 2:
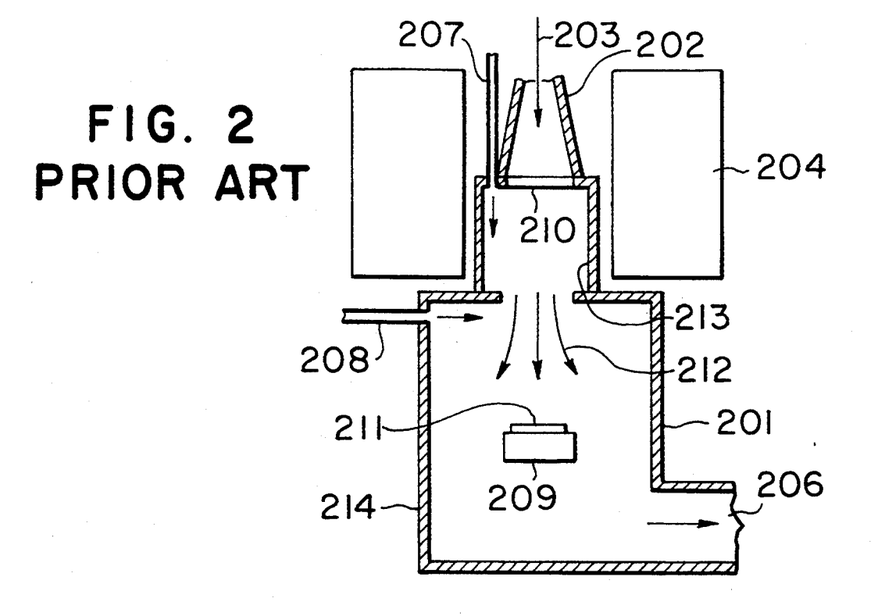
FIG. 2 is a longitudinal cross section of another example of a conventional plasma treatment apparatus.

Another example of the conventional plasma treatment apparatus utilizing the ECR has been disclosed by, for example, JP-A-56-155535 and JP-A-57-79621 and is shown in FIG. 2. In the plasma treatment apparatus shown in FIG. 2, plasma-activated species are produced in a plasma generation chamber 213 and a divergent magnetic field generated by a magnetic field generation coil 204 causes the flow of plasma to impinge upon an object 211 to be treated disposed at a position sufficiently away from a region at which the efficiency of generation of the plasma activated species is the maximum.

In the just-mentioned conventional plasma treatment apparatus, since a vacuum vessel 201 includes the plasma generation chamber 213 and a plasma treatment chamber 214 having a relatively large axial length, as shown in FIG. 2, the size of the vacuum vessel 201 becomes large and hence the size of an exhaust port 206 and the size of the magnetic field generation coil 204 becomes correspondingly large.

Experiments by the present inventors have revealed that in a plasma treatment utilizing the ECR, the treatment characteristics depend on a distance between the ECR position and the object 211 to be treated and improve at smaller distances. The inventors have also found that if the concentration of a gas at the ECR position is made high, a microwave 203 is almost absorbed at the ECR position and does not reach the object 211 so that reflection of the microwave from the object 211, and object supporting base 209, etc. disappears.

When constructing the apparatus shown by FIG. 2, shortening the axial length of the vacuum vessel 201 by positioning the object 211 near a microwave introducing window 210 may be considered. However, if that is done, the reflection of the microwave from the object 211 is present, thereby lowering the efficiency of the treatment with plasma and the plasma treatment characteristics.

The conventional microwave treatment apparatus involving a magnetic field can be classified broadly into two types, i.e. (1) one type in which a magnetic field generating portion is disposed outside of a plasma generation chamber and the flow of plasma produced is applied onto a surface to be treated positioned substantially perpendicular to the direction of a magnetic line of force, as has been disclosed by JP-A-56-155535, and (2) a second type in which a magnetic field generating portion is disposed outside of a vacuum vessel and the flow of plasma is applied onto a surface to be treated positioned substantially parallel to the direction of a magnetic line of force, as has been disclosed by JP-A-58-125820.

In either of the above-mentioned types (1) and (2), since the magnetic field generating portion is disposed outside of the vacuum vessel, it is difficult to more efficiently utilize a magnetic field and to decrease the size of the apparatus. Namely, since a coil or permanent magnet for generating a magnetic field necessary for the generation of a plasma in the vacuum vessel is disposed outside of the vacuum vessel, the magnetic field generated cannot be effectively utilized and hence strengthening the generated magnetic field by supplying a large current through the coil or by making the size of the magnet large is necessary. Therefore, the volume of the treatment apparatus or the floor area occupied by the treatment apparatus becomes undesirably large.

Further, in the above-mentioned types (1) and (2) of apparatuses, the control of the distribution of reactive gases and the distribution deposition seeds in the vacuum vessel are not considered. Therefore, the vacuum vessel is filled with excess reactive gases and deposition seeds so that the film is formed not only on the surface of an object to be treated but also on an inner wall of the vacuum vessel. Therefore, alien or undesired substances (or deposits) are produced in flakes, the maintenance frequency increases, and an undesirably large exhaust system is required for exhausting the excess reactive gases.

In addition, where a cylinder-like structure such as a photosensitive drum is to be treated, the following problems exist.

Namely, in the above-mentioned type (1) disclosed by JP-A-56-155535, the diameter of the vacuum vessel must be made much larger than the dimension of the cylinder-like structure so that a sufficient space of gas ventilation can be established to uniformly distribute deposition of a film to be formed and a flow of the gas and the evacuation can be facilitated. Therefore, the apparatus must be made remarkably large. Further, since only a part of a surface to be treated is treated at a time, total treatment time becomes long.

In the type (2) disclosed by JP-A-58-125820, that the quality of a film formed greatly depends on a distance between the ECR point and a surface to be treated and that the quality of a film formed on a surface greatly distanced from the ECR point becomes unhomogeneous are not considered.

SUMMARY OF THE INVENTION the present invention provides a microwave plasma treatment apparatus capable of improving the reaction efficiency (or film deposition rate) and the film quality.

To achieve the first object, a microwave plasma treatment apparatus according to one aspect of the present invention and comprising a vacuum vessel including a discharge section, a reaction section, a first gas introducing port and a second gas introducing port, microwave introducing means for introducing a microwave into the discharge section, magnetic field generating means for forming a magnetic field in the vacuum vessel, and a substrate plasma placed in the reaction section, a thin film being formed on the substrate by introducing first and second predetermined gases from the first and second gas introducing ports, is characterized in that the first gas introducing port and the second gas introducing port are disposed on the microwave introduction side with respect to an electron cyclotron resonance (ECR) point or portion defined by the microwave and the magnetic field while the substrate is disposed on a side reverse to the microwave introduction side with respect to the ECR point.

The first gas introduced from the first gas introducing port into the vacuum vessel turns into a plasma by virtue of the microwave and is transported toward the substrate. On the other hand, the second gas introduced from the second gas introducing port into the vacuum vessel impinges against the plasma of the first gas to be activated as a plasma and is also activated as a plasma by the microwave. Electrons in these plasmas make their motions (or circular motions) at the ECR point, thereby producing a plasma of a higher density. As a result, the initial reaction is rapidly accelerated so that a reaction product is deposited on the substrate.

A second object of the present invention is to provide a plasma treatment apparatus the size of which can be made small without lowering the plasma treatment characteristics.

To achieve the second object, a plasma treatment apparatus according to another aspect of the present invention is characterized in that a reactive gas is introduced within an ECR plane formed substantially perpendicular to the direction of propagation of a microwave, thereby providing a state in which the concentration of the reactive gas is high in the ECR plane.

With the above-mentioned feature, a region including the ECR plane forms a high absorption band of the microwave, thereby remarkably lowering the transmittance of the microwave therethrough. Therefore, even if a microwave introducing portion and an object to be treated are positioned in the vicinity of the ECR position, the plasma treatment becomes possible without lowering the plasma treatment characteristics. As a result, at least the length of the vacuum vessel in the direction of propagation of the microwave can be shortened remarkably as compared with that of the conventional apparatus, thereby providing a plasma treatment apparatus of a small size.

The plasma treatment characteristics including the film formation characteristic, the etching rate, etc. are substantially determined by the type, concentration and lifetime of plasma-activated species. Since a position at which the plasma-activated species are produced at the greatest number corresponds to the ECR position, the type and concentration of plasma-activated species are determined at the ECR position and whether or not the plasma-activated species reach the object to be treated is determined by a distance between the ECR position and the object to be treated. Also, the propagation of the microwave depends on the absorption thereof by molecules, atoms, ions, etc. at the ECR position and in the vicinity thereof. The higher the concentration of those gases, the lower the transmittance of the microwave at the ECR position and in the vicinity thereof becomes. Accordingly, if the concentration of reactive gases in the ECR plane (or a plane having the magnetic flux density B which satisfies $$\omega = B \cdot \frac{e}{m},$$

$\omega$ being the frequency of the microwave, e being the charge amount of the electron and m being the mass of the electron) formed substantially perpendicular to the direction of propagation of the microwave is enhanced by blowing or driving a reactive gas toward the ECR plane or letting a reactive gas flow in parallel to planes including the ECR plane, a high absorption band of the microwave is formed in a region including the ECR plane, thereby suppressing the propagation of the microwave to the object to be treated or the reflection of the microwave from the object or an object supporting base. Therefore, the practical efficiency of the microwave introduced is not deteriorated. Accordingly, even if the microwave introducing portion and the object to be treated are positioned in the vicinity of the ECR position, the plasma treatment can be performed without lowering the plasma treatment characteristics.

A third object of the present invention is to provide a plasma treatment apparatus which has a compact size and in which the formation of a uniform film can be made at a high speed and the maintenance can be simplified.

To achieve the third object, a plasma treatment apparatus according to a further aspect of the present invention is characterized in that a magnetic field generating portion is disposed inside of an object to be treated with a plasma and a reactive gas is blown onto a surface of the object from a near distance. With such features, the concentration of the reactive gas in the vicinity of the surface of the object to be treated is enhanced and the optimum magnetic field strength distribution for causing an electron cyclotron resonance is produced in the vicinity of the surface of the object.

By disposing the magnetic field generating portion inside of the object to be treated with the plasma, a compact-sized magnetic field generating portion can be realized easily. Also, since the surface of the object to be treated is positioned near the magnetic field generating portion so that the strength of a magnetic field necessary for causing the ECR is generated in the vicinity of the surface of the object to be treated with the plasma, a coil current can be reduced or the size of a magnet can be made small. As a result, the whole of the apparatus can be constructed with a compact size.

In a microwave plasma treatment involving a magnetic field, the film formation rate is proportional to the concentration of a reactive gas at a position where the ECR is caused, and is substantially inversely proportional to a distance between the ECR position and a surface to be treated. As that distance is shorter, the denseness of a film formed is increased or a satisfactory film can be obtained. In the present invention, by enhancing the concentration of a reactive gas in the vicinity of the surface to be treated and causing the ECR at such a position, the film formation rate can be increased, thereby providing the film having a satisfactory quality.

Further, since the reaction takes place in the surface to be treated, the most of deposition seeds deposit on a desired surface. It is not necessary to fulfill the whole of the vacuum vessel with a reactive gas. Therefore, the amount of deposits which may adhere to the inner wall of the vacuum vessel, can be reduced. Further, the efficiency of utilization of the reactive gas can be improved and the amount of non-reacted gases to be exhausted can be reduced correspondingly.

The above-mentioned features can be employed in a combination thereof.

DETAILED DESCRIPTION

The present invention will now be explained referring to embodiments shown in the accompanying drawings.

Figure 5A:
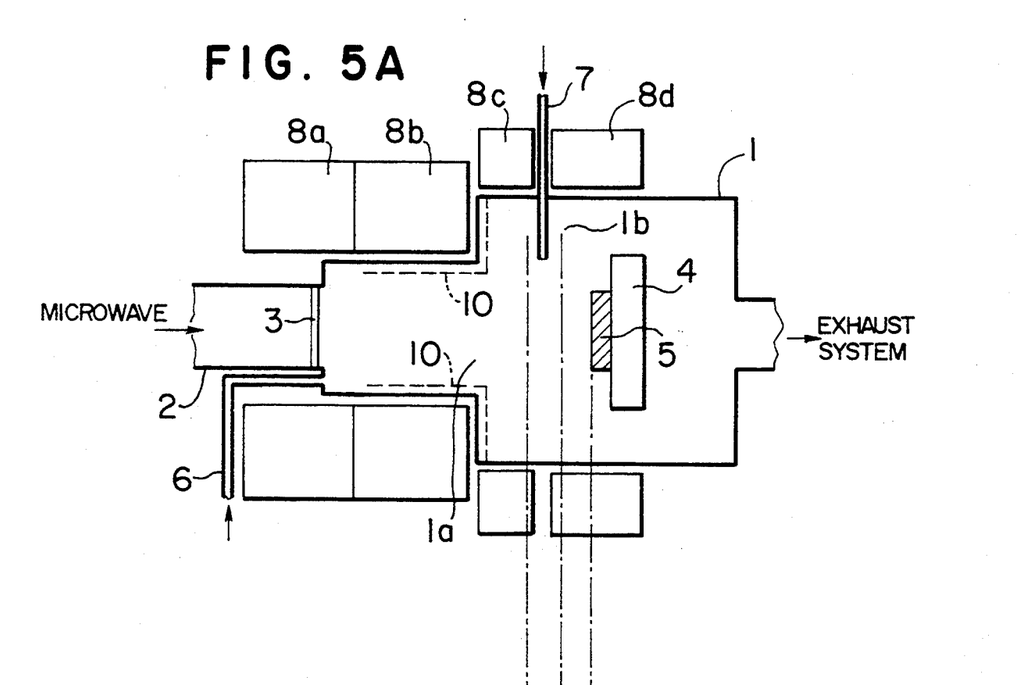
FIG. 5A is a schematic view of a microwave plasma treatment apparatus according to an embodiment of the present invention and FIG. 5B the distribution of magnetic field strengths in the apparatus.
Figure 5B:
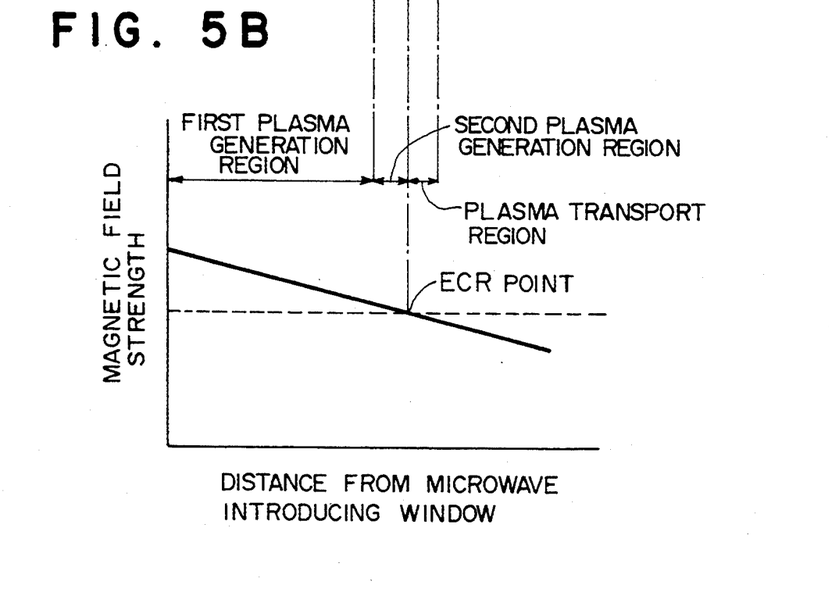

FIG. 5A shows a schematic view of a microwave plasma treatment apparatus according to an embodiment of the present invention and FIG. 5B shows the distribution of magnetic field strengths in the apparatus shown in FIG. 5A. In FIG. 5A, the same parts or components as those in FIG. 1A are designated with the same reference numerals as those in FIG. 1A. Therefore, explanation of those parts or components will be omitted. In FIG. 5A, reference numerals 8a, 8b, 8c and 8d designate four electromagnetic coils wound around the vacuum vessel 1. The conventional apparatus shown in FIG. 1A and the apparatus of the present embodiment shown in FIG. 5A are different from each other in the number of electromagnetic coils and the arrangement thereof.

Next, the operation of the apparatus of the present embodiment will be explained referring to the magnetic field strength distribution shown in FIG. 5B. Like FIG. 1B, the abscissa of FIG. 5B represents a distance from the microwave introducing window 3 and the ordinate thereof represents the strength of a magnetic field. Also, broken line indicates the magnetic field strength of 875 Gauss. In the present embodiment, a magnetic field strength as shown in FIG. 5B is formed in the vacuum vessel 1 by adjusting currents supplied to the electromagnetic coils 8a to 8d. Namely, an ECR point is caused to exist in the vicinity of the substrate 5 and closer to the substrate 5 than the gas conduit 7.

When a gas is introduced from the gas conduit 6 under such a magnetic field strength distribution, this gas develops into a plasma by virtue of a microwave. In FIG. 5B, this plasma region is termed a first plasma generation region. The plasma is transported toward the substrate 5. A raw material gas from the gas conduit 7 is introduced in the course of transport. This raw material gas turns into a plasma under the influence of the microwave as well as through the impingement against the plasma transported from the first plasma generation region. A region where the raw material gas turns into the plasma is termed a second plasma generation region in FIG. 5B.

When those plasma reach the ECR point, electrons in the plasma make their motions (or circular motions). The circularly moving electrons and particles in the plasma repeatedly impinge producing a plasma of a higher density. Thus, a desired reaction is rapidly accelerated to yield a reaction product which in turn is transported to the substrate 5 and deposited thereon. In FIG. 5B, a region between the ECR point and a surface of the substrate 5 is termed a plasma transport region.

Instead of the providing the gas conduit 6, the discharge section 1a of the vacuum vessel 1 may be formed with a double cylinder structure as indicated by dotted line 10 in FIG. 5A to introduce a gas through a space defined by between the two cylinders. In such a structure, a more uniform gas flow can be provided.

Now, a concrete example of forming a film of silicon oxide using the apparatus of this first embodiment will be described. Currents supplied to the electromagnetic coils 8a to 8d were adjusted to control the distribution of magnetic field strengths so that an ECR point is located just before the substrate 5 at the maximum magnetic field strength of 2500 Gauss. Oxygen was supplied at 140 ml/min from the gas conduit 6 while a mixture gas of monosilane ($SiH_4$) at 20 ml/min and helium 80 ml/min was supplied from the gas conduit 7. A pressure in the vacuum vessel 1 was 1.0 mTorr. A silicon wafer was used as the substrate 5 and a microwave having a frequency of 2.45 GHz and an output of 400 W was used. The results are shown in Table 1 together with the results where a film was formed by using the conventional apparatus and the results where a film was formed in an atmosphere of high temperature (or through thermal oxidization).

TABLE 1

| | Apparatus of Embodiment | Conventional Apparatus | Thermal oxidization |
| --- | --- | --- | --- |
| Conditions of Film Formation | | | |
| Maximum Magnetic field Strength | 2500 Gauss | 1000 Gauss | — |
| Substrate Temperature | about 100° C. | about 100° C. | 1100° C. |
| Reactive Gas | $SiH_4 + O_2$ | $SiH_4 + O_2$ | $H_2O$ |
| Film Formation Characteristics | | | |
| Deposition Rate | 370 nm/min | about 200 nm/min | — |
| Film Thickness Distribution (5"o) | ±4% | ±4% | — |
| Properties of Deposited Film | | | |
| Peak Position of Infrared Absorption Spectrum | 1080 $cm^{-1}$ | 1072 $cm^{-1}$ | 1082 $cm^{-1}$ |
| Refractive index | 1.455–1.460 | 1.440–1.465 | 1.45–1.46 |
| Etch Rate (Buffer HF) | 6–20 Å/s | 8–100 Å/s | 6–10 Å/s |
| Etch Rate (P Etchant) | 6–70 Å/s | 200–600 Å/s | 2 Å/s |
| Surface-state Charge Density | (6–10) × $10^{10}$ $cm^{-2}$ | (6–10) × $10^{10}$ $cm^{-2}$ | 8 × $10^{10}$ $cm^{-2}$ |

Figure 13:
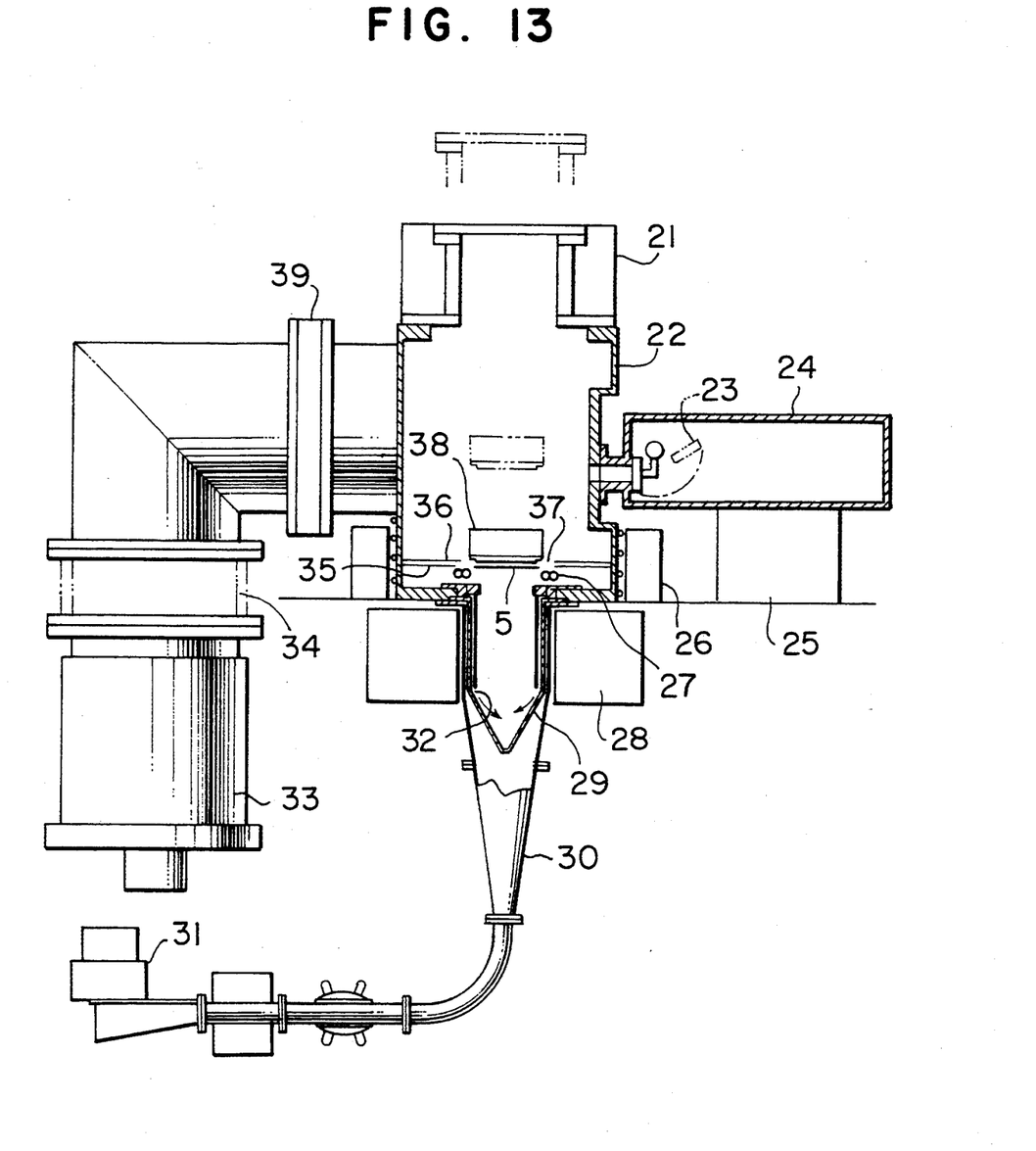
FIG. 13 is a longitudinal cross section of a plasma-activated CVD apparatus used in the embodiment shown in FIG. 5A.

FIG. 13 is a detail drawing of a plasma-activated CVD (Chemical Vapor Deposition) apparatus used in the present embodiment. Referring to FIG. 13, reference numeral 21 designates a lift driver, numeral 22 a reaction chamber, numeral 23 a gate valve, numeral 24 a sample or object taking-in/out chamber, numeral 25 a sample exchange driver, numeral 26 a control magnetic field generating coil, numeral 27 a control electrode, numeral 28 an ECR coil, numeral 29 a discharge tube, numeral 30 a waveguide for guiding a microwave, numeral 31 a magnetron for generating the microwave, numeral 32 a plasma gas blowing port, numeral 33 a turbo molecular pump, numeral 34 a bellows, numeral 35 a shutter, numeral 36 a damper, numeral 37 a reactive gas blowing port, numeral 38 a substrate holder (or heating base), and numeral 39 a throttle valve. In this apparatus, the plasma blowing port 32 has a double cylinder structure in which a cylindrical member is provided inside of the discharge tube 29. The reactive gas blowing port 37 has a plurality of nozzles on the inner periphery of a ring-like pipe.

In Table 1, the etching rate shows a speed at which a silicon oxide film formed dissolves, and a solvent is shown in the parenthesis. The solvent "Buffer HF" is a solution containing the mixture of HF (49%) and $NH_4F$ at the ratio of 1:6, and the solvent "P. Etchant" is a solution containing the mixture of HF (49%), $HNO_3$ (69%) and $H_2O$ at the ratio of 1.5:1:30.

As is shown in the deposition rate in Table 1, the apparatus according to the present embodiment can form a film at the deposition rate about twice as high as that in the conventional apparatus, thereby remarkably improving the efficiency of reaction. This improved rate may results because the raw material gas introduced from the gas conduit 7 is activated by a plasma from the plasma generation region as well as the introduced microwave.

As is shown the peak position of infrared absorption spectrum and the etching rate in Table 1, a thin film formed in according to this embodiment has a higher quality than that of a thin film formed by the conventional apparatus. For example, the etch rate of the thin film formed according to the present embodiment is smaller than that of the thin film formed by the conventional apparatus. The thin film of the present embodiment is hard to dissolve or is dense. Generally, a thin film formed through thermal oxidization is characterized by its high density. The density of the thin film formed according to the present invention approaches the density of the thin film formed through thermal oxidization.

Next, a concrete example in which a film of silicon is formed using the apparatus of this embodiment will be explained. Using the same construction of the apparatus as in the above-explained concrete example in which the film of silicon oxide has been formed, helium was supplied at 60 ml/min from the gas conduit 6 while monosilane was supplied at 20-100 ml/min from the gas conduit 7. A pressure in the vacuum vessel 1 was 0.8 mTorr. As a result, a silicon film formed at the maximum deposition rate of 600 nm/min was observed. This deposition rate is greatly improved as compared with the maximum deposition rate of 100 nm/min at the conventional apparatus. Further, the deposited silicon film was examined by Raman spectrography and X-ray diffraction. The Raman spectrographic examination has revealed that the proportion of crystal components exsisting in the silicon film deposited according to the present embodiment is about ten times as high as that in the silicon film formed by the conventional apparatus, and the examination by X-ray diffraction has revealed that the X-.ray diffraction intensity of the silicon film formed in accordance with the present embodiment is 200-1000 times as high as that of the silicon film formed by the conventional apparatus. This means that the silicon film formed by the conventional apparatus is mainly composed of amorphous silicon while the silicon film formed in according to the present embodiment is mainly composed of polycrystalline silicon and has a remarkably improved density.

Thus, in the present embodiment, since currents supplied to electromagnetic coils are adjusted so that an ECR point is caused to exist near a substrate as compared with a raw material introducing position and in the vicinity of the substrate, the efficiency of reaction of the raw material gas and the quality of a film formed can be improved. The improvement of the reaction efficiency can improve the rate of deposition of the film, reduce the amount of the raw material gas consumed and facilitate the processing of waste gas and maintenance.

Though the above explanation of the embodiment has been made in the example in which the ECR point is caused to exist in the vicinity of the substrate, obviously the ECR point may exist at any point (for example, the point shown in FIG. 2) if the substrate is caused to be positioned in the vicinity of the ECR point. In any case, the raw material introducing position exists away from the substrate as compared with the ECR point. Also, the number and/or arrangement of electromagnetic coils can be selected arbitrarily in accordance with various condition.

As has been mentioned above, since the first gas introducing port and the second gas introducing port are disposed along the microwave introduction side with respect to the ECR point, the raw material gas reacts more efficiently film formed has a higher quality A more efficient reaction can improve the deposition rate of the film.

Figure 6:
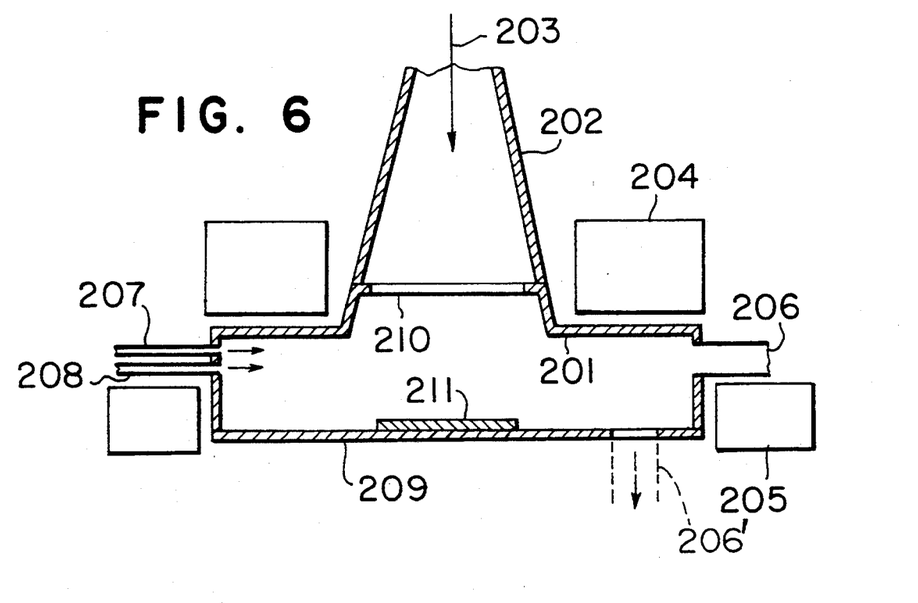
FIG. 6 is a longitudinal cross section of a plasma treatment apparatus according to another embodiment of the present invention.

FIG. 6 shows a plasma treatment apparatus according to another embodiment of the present invention.

Referring to FIG. 6, a vacuum vessel 201 has an axial length smaller than its diameter. A microwave guide tube 202 is provided so as to introduce a microwave 203 in the axial direction of the vacuum vessel 201 from a microwave introducing window 210 provided at an upper end of the vacuum vessel 201. Reactive gas supplying tubes 207 and 208 and an exhaust port 206 are formed at a side face of the vacuum vessel 201, and an object 211 to be treated is disposed on a substrate supporting base 209 provided on the bottom of the vacuum vessel 201. The vacuum vessel 201 thus constructed has a diameter of 350 mm and an axial length of 62 mm. The microwave 203 supplied from the microwave guide tube 202 has a power of 300 W, a frequency of 2.45 GHz and a wavelength of 123 mm.

Figure 7:
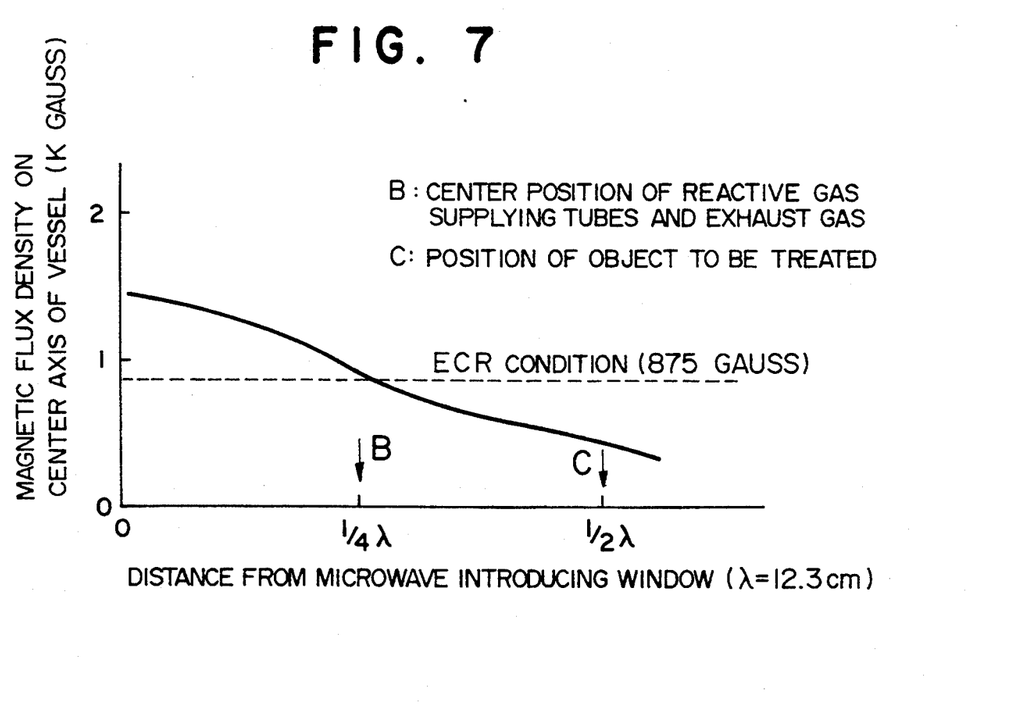
FIG. 7 is the distribution of magnetic flux densities along the center axis of a vacuum vessel of the apparatus shown in FIG. 6.

FIG. 7 illustrates relation between the center positions of the reactive gas supplying tubes 207, 208 and exhaust port, the position of the microwave guide tube 210 and the position of the object 211 to be treated. FIG. 7 shows the distribution of magnetic flux densities along the center axis of the vacuum vessel 201. Broken line in FIG. 7 shows the value of a magnetic flux density which satisfies a condition of ECR (875 Gauss) for the microwave 203 of 2.45 GHz. As is apparent, the ECR condition is satisfied at a position of 31 mm distanced from the microwave introducing window 210 by one-fourth of the wavelength $\lambda$ of the microwave, and this position corresponds to positions at which the reactive gases from the reactive gas supplying tubes 208 and 208 are introduced. The object 211 to be treated is at a position distanced from the microwave introducing window 210 by ($\frac{1}{2}$) $\lambda$. In FIG. 7, the point "0" represents the position of the microwave introducing window 210. The above-mentioned magnetic flux density distribution is obtained by controlling currents to magnetic field generation coils 204 and 205 provided at the other periphery of the vacuum vessel 201 as shown in FIG. 6. These magnetic field generation coils 204 and 205 are arranged in a manner distributed on both the sides of the reactive gas supplying tubes 207 and 208 in the axial direction of the vacuum vessel 201.

Next, the case where a silicon wafer having a diameter of 100 mm is used as the object 211 to be treated, a surface of the object to be treated is placed in the face of the direction of propagation of the microwave 203 and a film of silicon dioxide ($SiO_2$) is to be formed will be explained.

In such a case, the microwave 203 has a power of 300 W, a frequency of 2.45 GHz and a wavelength of 123 mm. Monosilane ($SiH_4$) and oxygen ($O_2$) are introduced at 20 ml/min and 80 ml/min from the reactive gas supplying tubes 207 and 208, respectively. The vacuum vessel 210 is evacuated to provide a pressure of $1 \times 10^{-3}$ Torr at which the reaction is made. The magnetic field generation coils 204 and 205 are controlled to satisfy the condition shown in FIG. 7.

At this time, a reflected version of the microwave 203 had a power of 20 W, the average rate of formation of a film was 60 nm/min, the index of refraction of the film deposited was 1.46, the rate of etching by buffer fluoric acid solution (HF: $NH_4F$=1:6) was 280 nm/min, and the ratio of Si to O in the film was 1.0:2.0.

For comparing with effects obtained by the present embodiment, an exhaust port 206' was formed at a position shown by dotted line in FIG. 6 to lower the gas concentration in the ECR plane and a film was formed with such a construction. In this case, a reflected version of the microwave having an input power of 300 W, had a power 250 W, which is remarkably large as compared with that in the present embodiment, the rate of deposition of the film was one-tenth of that in the present embodiment, and the etching rate of the film deposited was 300 times as high as that in the present embodiment. Thus, the film formation characteristics were remarkably deteriorated.

Figure 3:
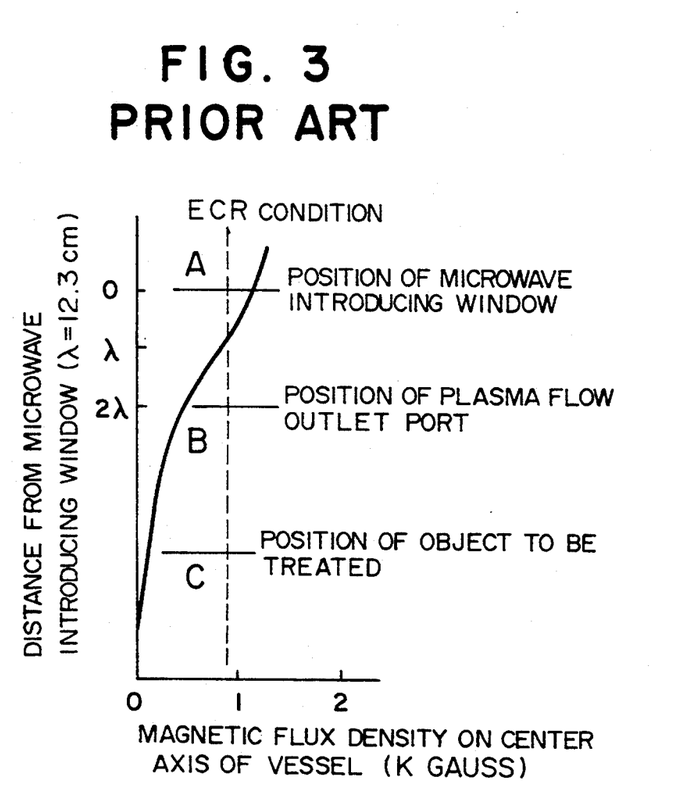
FIG. 3 is the distribution of magnetic flux densities along the center axis of a vacuum vessel of the apparatus shown in FIG. 2.

FIG. 3 shows the distribution of magnetic flux densities on the center axis of the vacuum vessel of the conventional plasma treatment apparatus of FIG. 2 based on the results of analysis thereof from the point of view as in the present embodiment. FIG. 3, shows that the condition of FIG. 7 is not satisfied. Therefore, the results forming an $SiO_2$ film by use of the plasma treatment apparatus like the present embodiment were that though a reflected version of the microwave 203 having an input power of 300 W has a power of 10 W, the film forms at a rate of 50 nm/min, the index of refraction of the film formed is 1.45, the etching rate of the formed film is 600 nm/ min, and the ratio of Si to O in the film is 1.9:2.0. As is apparent from comparing these film formation characteristics and the above-described film formation characteristics in the present embodiment, the formation of a high absorption band of the microwave 203 by enhancing the concentration of reactive gas in the ECR plane as in the present embodiment makes shortening the axial length of the vacuum vessel 201 in the direction of propagation of the microwave without substantially changing the practical efficiency of the microwave and while improving the plasma treatment characteristics possible.

Figure 8:
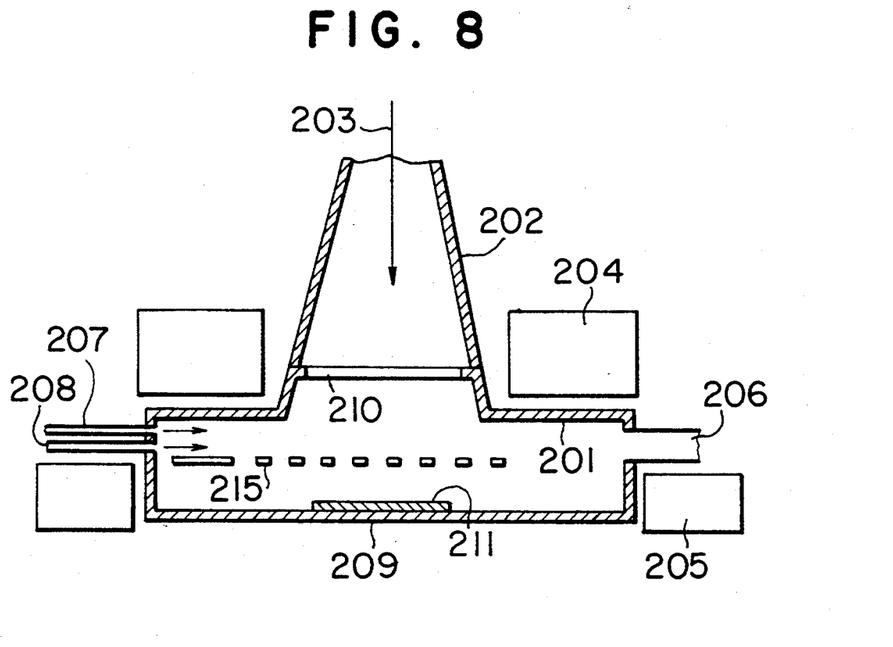
FIG. 8 is a longitudinal cross section of a plasma treatment apparatus according to still another embodiment of the present invention.

FIG. 8 shows a plasma treatment apparatus according to a third embodiment of the present invention. The apparatus of the third embodiment differs from the apparatus of the embodiment of FIG. 6 in that a porous dash board 215 is disposed on the side of the object 211 to be treated and parallel to the flow of the reactive gases from the reactive gas supplying tubes 207 and 208. The porous dash board 215 is made of quartz for of providing a conductance of the gases to suppress the diffusion of the reactive gases toward the object 211 to be treated.

The results of forming an $SiO_2$ film by use of the plasma treatment apparatus of the third embodiment under a similar condition to that in the plasma treatment apparatus of the embodiment shown in FIG. 6, were: a reflected version of the microwave 203 having an input power of 300 W had a power of 1 W; the film was 58 nm/min, formed at a rate of the index of refraction of the film formed was 1.46, the etching rate of the film was 180 nm/min; and the ratio of Si to O in the film was 1.0:2.0. Accordingly, in the third embodiment, the film formation rate is somewhat decreased compared with the embodiment of FIG. 6 but the etching ate is reduced, thereby further improving the quality of the film.

Also in the third embodiment, since the reactive gas is made to flow substantially parallel to the ECR plane to enhance the concentration of the reactive gas in the ECR plane, thereby forming a high absorption band of the microwave, the degree of transmission of the microwave 203 to the object 211 to be treated can be remarkably reduced and hence each of a distance between the microwave introducing window 210 and the object 211 and a distance between the object 211 and the ECR position can be shortened, thereby allowing the size of the vacuum vessel 201 in its axial direction or in the direction of propagation of the microwave to be decreased.

In the above-described embodiments of FIGS. 6 and 8, the improved practical efficiency of generation of a plasma and reduced of the reflected microwave can be expected by establishing a relation between the position of the microwave introducing window 210, the ECR position and the position of the object 211 in such a manner that the microwave introducing window 210 is formed at a position where the strength of the alternate electric field of the microwave 203 introduced becomes substantially zero, the ECR position is located at a position distanced from the microwave introducing window 210 by $(\frac{1}{4}+n)\lambda (n=0, 1, 2, \ldots)$ and the object 211 is placed at a position distanced from the microwave introducing window 210 by $(\frac{1}{2}+n)\lambda$. Also, if the magnetic fields generated by the magnetic field generating coils 204 and 205 have a distribution of magnetic flux densities which monotonically decrease in the direction of propagation of the microwave 203, a hindrance to introduction of the microwave 203 can be prevented. Further, the use of the vacuum vessel 201 having an axial length thereof in the direction of propagation of the microwave 203 smaller than a diameter thereof as shown in FIGS. 6 and 8 is practically advantageous in obtaining the above-mentioned effects.

As has been explained above, in the embodiments shown in FIGS. 6 and 8, since the reactive gas is introduced in the ECR plane formed substantially perpendicular to the direction of propagation of the microwave to produce a state in which the reactive gas is highly concentrated, decreasing the size of the vacuum vessel, especially, in the direction of propagation of the microwave, without deteriorating the plasma treatment characteristics is possible.

Figure 9:
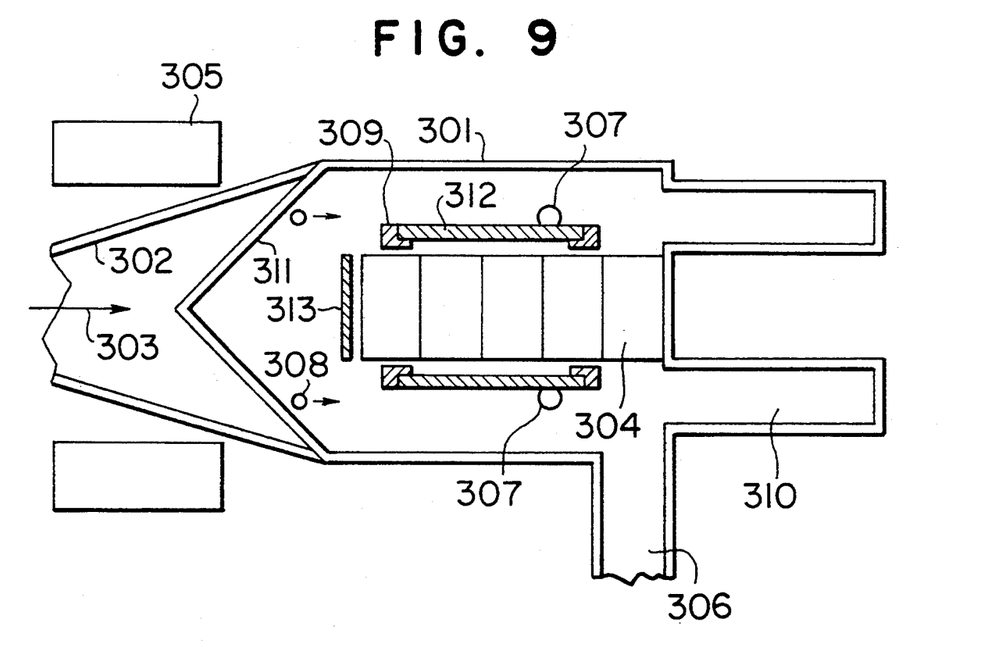
FIG. 9 is a longitudinal cross section of a plasma treatment apparatus according to a further embodiment of the present invention.

FIG. 9 shows schematically a main part of a plasma treatment apparatus according to a further embodiment of the present invention. The apparatus of the present embodiment comprises a vacuum vessel 301, a microwave guide tube 302 for guiding a microwave 303 from a microwave oscillator (not shown), a main magnetic field generating coil 304 (with iron core) for ECR generating, an auxiliary magnetic field generation coil 305, an exhaust port 306 (having an exhaust system not shown), a reactive gas supplying tube 307, a plasma gas supplying tube 308, a drum holder 309, a drum receiving chamber 310, and a magnetic shield plate 313.

The vacuum vessel 301 has a diameter of 450 mm$\phi$ and a length of 850 mm. One end of the vacuum vessel 301 is provided with a microwave introducing window 311 having a conic shape and made of quartz while the other end thereof is provided with the drum receiving chamber 310. The drum holder 309 is movable in the direction of the center axis of the vacuum vessel 301 and rotatable around the center axis of the vacuum vessel 301.

The auxiliary magnetic field generation coil 305 and the magnetic shield plate 313 are provided for reducing a magnetic field directed to the direction of propagation of the microwave to prevent any hindrance to propagation of the microwave.

Also, the reactive gas supplying tube 307 arranged along the surface of a drum 312 has 25 openings of 1 mm$\phi$ provided at equal intervals on the inner side of the tube or on the side of a surface to be treated with plasma.

Figure 10A:
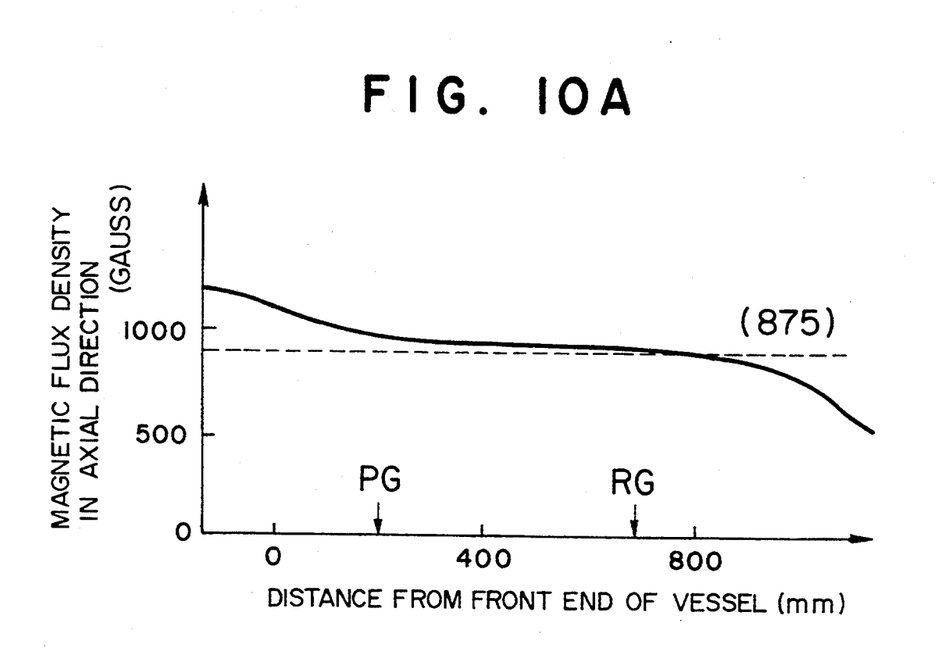
FIGS. 10A and 10B are the distributions of magnetic flux densities in the apparatus shown in FIG. 9.
Figure 10B:
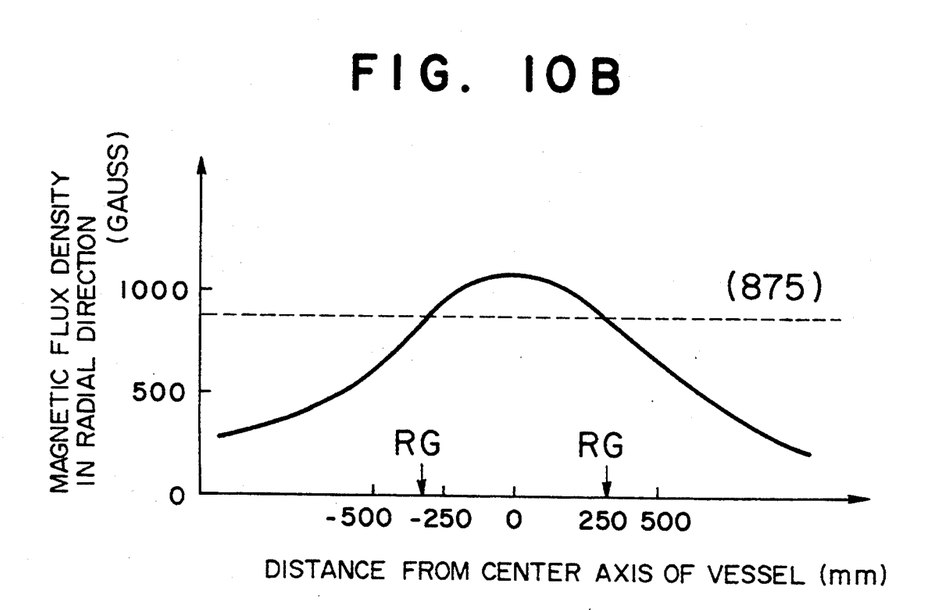

FIGS. 10A and 10B show the distributions of magnetic flux densities obtained in the present embodiment as will be mentioned hereinbelow. Namely, FIG. 10A shows the magnetic flux density distribution along a direction of the drum 312 surface, and FIG. 10B shows the magnetic flux density distribution along a radial direction from the center axis of the vacuum vessel 301. In these figures, arrow PG on the abscissa represents the position of the plasma supplying tube 308 and arrow RG represents the position of the reactive gas supplying tube 307.

As seen from FIG. 10A, the magnetic field strength decreases gradually along the direction of progression of the microwave, and a magnetic field strength (875 Gauss) with which a condition of ECR is satisfied, is obtained in the vicinity of the position of the reactive gas supplying tube 307.

A control for realizing the magnetic flux density distributions shown in FIGS. 10A and 10B was conducted by dividing the main magnetic field generation coil 304 into five coils as shown in FIG. 9 and adjusting the value of current supplied to each coil while adjusting the value of current supplied to the auxiliary coil 305.

Figure 4:
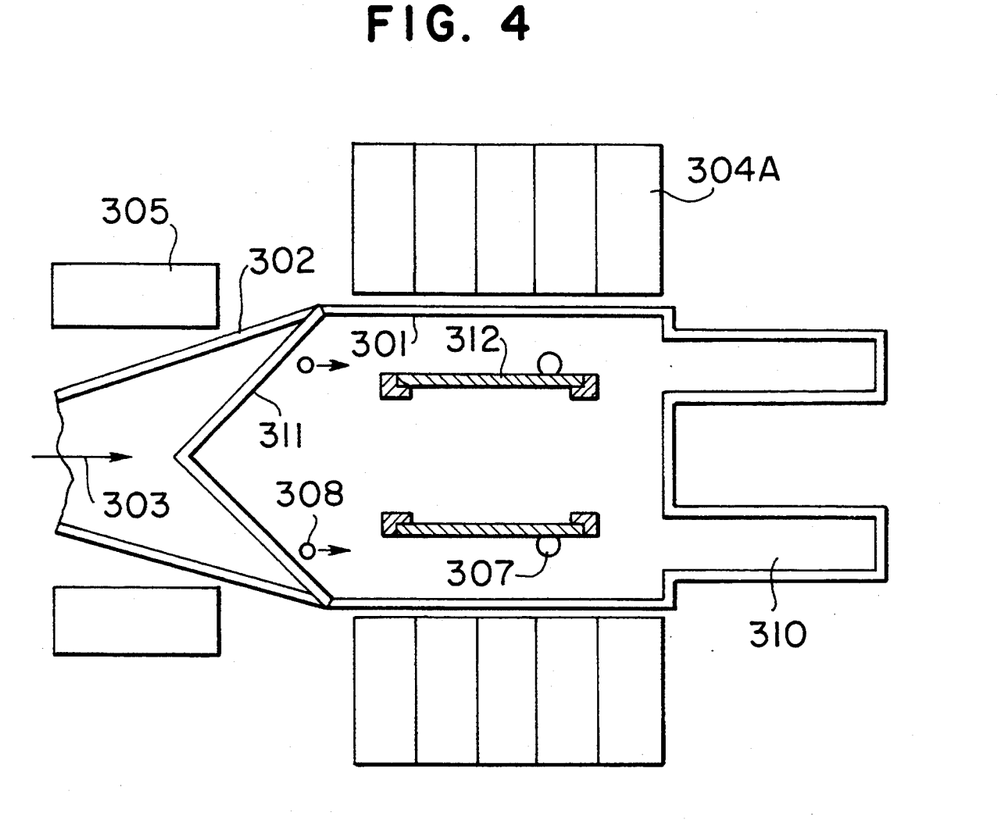
FIG. 4 is a longitudinal cross section of still another example of a plasma treatment apparatus, referred to for comparison.

For comparing with FIG. 9, FIG. 4 shows the plasma treatment apparatus in which the same magnetic flux density distribution as that shown in FIG. 10A is formed by a main magnetic field generation coil 304A disposed outside of a vacuum vessel 301. In FIG. 4, the same or equivalent parts as or to those in FIG. 9 are designated with the same reference numerals as those in FIG. 9.

Referring to FIG. 4, the main magnetic field generation coil 304A is arranged outside of the vacuum vessel 301. Clearly, to produce a magnetic field with a predetermined strength in the vicinity of a surface of an object to be treated, supplying a current to supply to the coil 304A, the current having a magnitude which corresponds to a required supply current to the coil 304 of FIG. 9 multiplied by the ratio of the area of cross section of the coil 304A to that of the coil 304 or to select the number of windings of the coil 304A to a value which corresponds to the required number of windings of the coil 304 multiplied by the above-mentioned ratio is necessary.

From comparing FIG. 9 with FIG. 4, apparently in the embodiment of FIG. 9, making the size of the apparatus and the required current small by disposing the main magnetic field generation part inside of the object to be treated is possible.

With the apparatus shown in FIG. 9, a cylindrical photoreceptor drum 312 (having a diameter of 262 mm$\phi$ and a length of 430 mm and made of Al) was used as the object to be treated, and a film of a-Si (amorphous silicon) was formed of a surface of the drum 312.

More specifically in a first method, helium was introduced at 40 ml/min from the plasma gas supplying tube 308 while a monosilane (SiH$_4$) was blown at 40 ml/min from the reactive gas supplying tube 307 to the surface of the drum 312 in the vicinity of the tube 307. Further, a magnetic field having a magnetic flux density of 875 Gauss was generated between the center of the reactive gas supplying tube 307 and the surface of the photosensitive drum 312 by the magnetic field generation coils 304 and 305 so that a film of amorphous silicon (a-Si) is formed on the surface of the drum 312. When forming the film, the vacuum vessel 301 was evacuated such that a pressure in the vessel 312 is $1 \times 10^{-4}$ Torr.

In this case, the of film formation rates on the surface of the photoreceptor drum 312 facing the openings of the reactive gas supplying tube 307 were distributed in a Gaussian manner which has the maximum rate of 2.5 $\mu$m/min and a Gaussian width of 1.3 cm. Therefore, the photoreceptor drum 312 was rotated at 60 r.p.m. by the drum holder 309 and was reciprocated 6 times per minute in the direction of the center axis of the vacuum vessel 301 so that an a-Si film having a thickness of 30 $\mu$m was formed on the entire surface of the drum 312.

The maximum error of film thickness was $\pm 7\%$ and a time required for forming the film was 120 minutes. The photoconductivity $\sigma_p$ of the film obtained was $3 \times 10^{-6}$ S/cm and the dark conductivity $\sigma_d$ thereof was $2 \times 10^{-13}$ S/cm, each having a maximum error within $\pm 3\%$.

Next or in a second method, a film of a-Si was formed such that monosilane was introduced not from the reactive gas supplying tube 307 but from the plasma gas supplying tube 308 in a form mixed with helium. The film formation conditions including the gas flow amount were the same as those in the first method. As a result, forming an a-Si film having a thickness of 30 $\mu$m required 210 minutes. Though the degree of fluctuation of film thickness was the same as that in the first method, $\sigma_p$p was reduced to $2 \times 10^{-8}$ S/cm and $\sigma_d$ was increased to $3 \times 10^{-11}$ S/cm. Also, the maximum error of the photoconductivity $\sigma_p$ was $\pm 9\%$ and the maximum error of the dark conductivity $\sigma_d$ was $\pm 11\%$. Namely, the degree of fluctuation of each conductivity was increased.

In forming the a-Si film in accordance with each of the first and second methods, an Si substrate was placed on the inner wall portion of the vacuum vessel 301 in the rear of the reactive gas supplying tube 307 to measure the weight of undesired substances or deposits which adhered to the Si substrate. The weight of undesired deposite in the case of the first method of reactive gas supply was about 100 times as large as that in the case of the second method of reactive gas supply.

Figure 11:
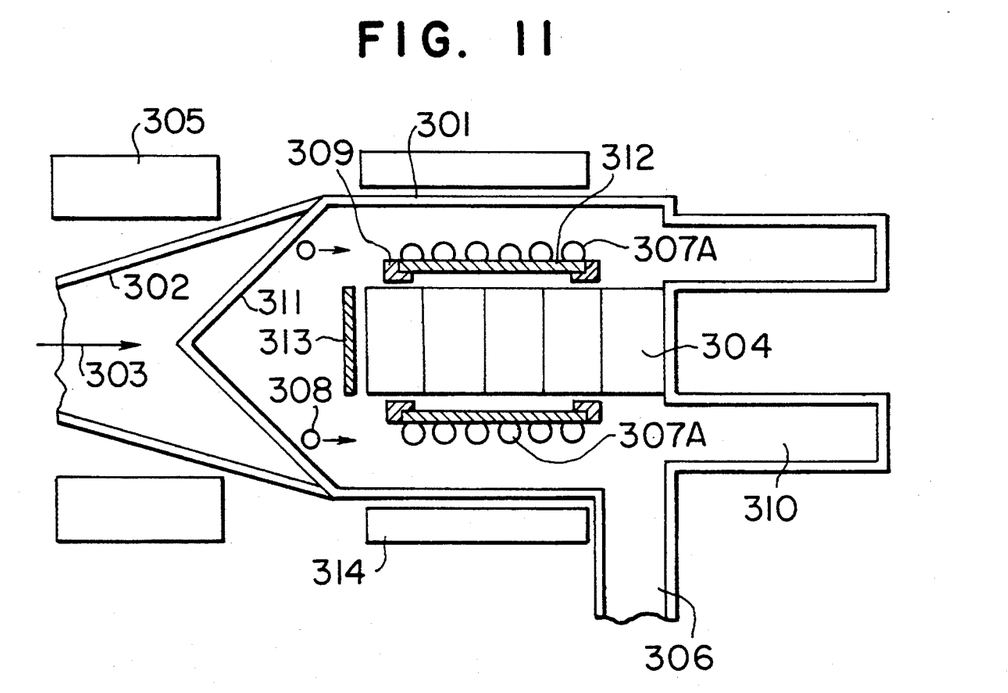
FIG. 11 is a longitudinal cross section of a plasma treatment apparatus according to a still further embodiment of the present invention.
Figure 12A:
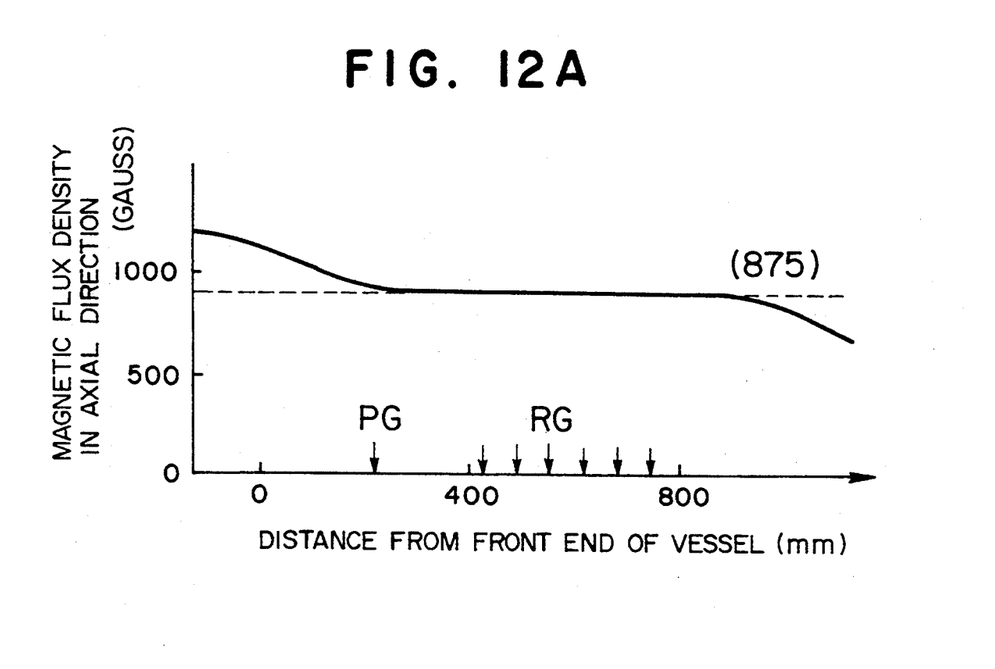
FIGS. 12A and 12B are the distributions of magnetic flux densities in the apparatus shown in FIG. 11.
Figure 12B:
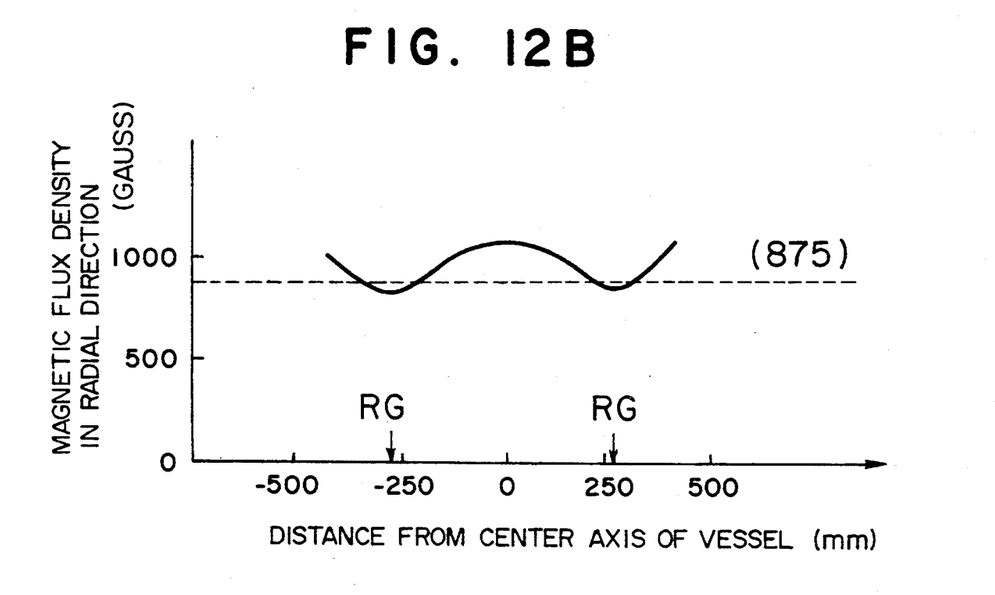

FIG. 11 shows in cross section a main part of a plasma treatment apparatus according to a still further embodiment of the present invention, and FIGS. 12A and 12B show the distributions of magnetic flux densities in the apparatus of FIG. 11 similar a r to those shown in FIGS. 10A and 10B. In FIGS. 11, 12A and 12B, the same or equivalent parts as or to those in FIGS. 9 and 10 are designated with the same reference numerals or symbols as those in FIGS. 9 and 10.

The embodiment shown in FIG. 11 differs from the embodiment of FIG. 9 in that a reactive gas supplying tube is disposed in a multi-stage arrangement as indicated by reference numeral 307A in FIG. 11 (or a plurality of reactive gas supplying tubes 307 are provided) and that a coil 314 for generating a magnetic field for preventing undesired substances or deposite from adhering to the inner wall of the vacuum vessel 301 is disposed on the outer periphery of the vacuum vessel 301.

With the construction shown in FIG. 11, the magnetic flux density distribution in the axial direction of the vacuum vessel 301 as shown in FIG. 12A can be obtained or a condition of ECR can be satisfied in the most of a region over which the reactive gas supplying tube 307A is arranged. Further, a mirror magnetic field as shown in FIG. 12B can be formed in the radial (or radius) direction of the vacuum vessel 301.

A film of a-Si was formed on the surface of a photoreceptor drum 312 such that monosilane is supplied from the multi-stage reactive gas supplying tube 307A while the value of a current supplied to a main magnetic field generation coil 304 is adjusted so as to elongate the ECR region as shown in FIG. 12B.

The supply amount of monosilane was 40 ml/min and was equally distributed to six reactive gas supplying tubes 307A. The other conditions were the same as those in the embodiment of FIG. 9. As a result, the same or similar values as or to those in the embodiment of FIG. 9 were obtained for the quality of the film formed and a time required for forming the film could be reduced to 70 minutes.

Further, by additionally providing outside of the vacuum vessel 301 the magnetic field generation coil 314 for preventing the adhesion of undesired deposite and by shaping the magnetic flux density distribution in the radial direction of the vacuum vessel 301 to form the mirror magnetic field as shown in FIG. 12A, the travel of ion seeds to the inner wall of the vacuum vessel could be suppressed to reduce the amount of undesired deposite adhered to the inner wall of the vessel to about one half of that in the embodiment of FIG. 9.

As has been mentioned above, according to the embodiments shown in FIGS. 9 and 11, since the main magnetic field generation section is disposed inside of the object to be treated, the size of the apparatus can be decreased.

Also, since the reactive gas is blown to the surface to be treated at a distance close to the object to be treated and a region having a high reactive gas concentration is formed in the vicinity of the surface to be treated and an ECR is caused in this region, the treatment for film formation is more efficient and the film quality is more uniform and higher. The increase in photoconductivity and the reduction in dark current can be realized especially where an a-Si film is formed. In addition, in the embodiments of FIGS. 9 and 11 have an effect that the amount of undesired deposite adhered to a portion other than the desired surface to be treated, for example, to the inner wall of the vacuum vessel can be reduced.

Further, in the embodiment shown in FIG. 11, since a reactive gas supplying system is constructed with multiple stages or multiple tubes and an ECR condition is satisfied equally in the vicinity of the multi-stage reactive gas supplying system, the treatment for film formation is more efficient. Also, since a magnetic field generation coil is additionally disposed outside of the vacuum vessel so that a mirror magnetic field is generated in the radial direction of the vacuum vessel, the amount of undesired deposite adhered to the inner wall of the vacuum vessel can be further reduced.

In the embodiments shown in FIGS. 9 and 11, the coil has been used for generating a magnetic field. However, naturally a permanent magnet may be used. Also, though the object to be treated had a cylindrical shape in the above examples, the object may have a planar structure.

The photoreceptor drum 312 shown in FIGS. 9 and 11 may be used as a mere support for the object to be treated. In this case, a (Si) substrate to be treated is stuck on the outer peripheral surface of the drum so that a film is formed on the substrate.

The effects common to the embodiments shown in FIGS. 9 and 11 can be summarized as follows.

Since a main magnetic field generation section is disposed inside of an object to be treated, the size of the apparatus can be decreased. Since the magnetic field generation section is placed near a surface of the object to be treated with plasma, a coil current can be reduced or the size of a magnet can be decreased.

Since a region having a high reactive gas concentration is formed in the vicinity of the surface to be treated and an ECR position is caused to exist in this region, not only can improve plasma treatment efficiency and improved and more uniform film quality be expected but also the the reactive gas can be much more efficiently utilized. Further, the amount of undesired deposits adhered to the inner wall of a vacuum vessel can be reduced. As a result, the maintenance of the apparatus can be simplified or facilitated. Also, since the amount of non-reacted gases to be exhausted decreases, the size of an exhaust system can be decreased.

We claim:

1. A plasma treatment apparatus for forming a thin film on a substrate by a reaction of two or more gases, said apparatus comprising:

a vacuum vessel;

a substrate placed in said vacuum vessel;

a microwave introducing window accommodated in said vacuum vessel for permitting microwaves to be introduced into said vacuum vessel;

a magnetic field generator for forming a magnetic field in said vacuum vessel such that said magnetic field and microwaves introduced through said microwave introducing window define an electron cyclotron resonance (ECR) area within said vacuum vessel, said ECR area being disposed between said microwave introducing window and said substrate;

a first gas introducing port for introducing a first gas into said vacuum vessel; and a second gas introducing port for introducing a second gas into said vacuum vessel, said second gas introducing port being independent of said first gas introducing port and spaced from said first gas introducing port in a direction from said microwave introducing window to said substrate, said first gas introducing port being disposed nearer than said second gas introducing port to said microwave introducing window, and said second gas introducing port being disposed in close proximity to said ECR area so that said second gas is introduced into said vacuum vessel in proximity to said ECR area.

2. A microwave plasma treatment apparatus according to claim 1 wherein said electron cyclotron resonance (ECR) area is nearer to said substrate than it is to said second gas introducing port.

3. A plasma treatment apparatus for treating an object, the apparatus comprising:
a vacuum vessel in which the object to be treated may be disposed, including a microwave introducing window introducing a microwave into said vessel, a reactive gas supplying tube flowing a reactive gas therethrough, and an exhaust port, means for generating a magnetic field provided outside of said vacuum vessel, an electron cyclotron resonance plane being defined defined by said magnetic field and a microwave introduced through said microwave introducing window,
said reactive gas being introduced to said electron cyclotron resonance plane,
wherein said reactive gas supplying tube is substantially coincident with said electron cyclotron resonance (ECR) plane such that a reactive gas concentration at the electron cyclotron resonance plane is higher than a reactive gas concentration near the microwave introducing window and is also higher than a reactive gas concentration on the substrate surface,
wherein a porous insulator dash board or insulator mesh is disposed between said reactive gas supplying tube and the object to be treated, said porous insulator dash board or insulator mesh being substantially parallel to a flow of said reactive gas to said object, wherein the insulator dash board or insulator mesh is disposed at least in a region above said substrate substantially in parallel to the electron cyclotron resonance plane.

4. A plasma treatment apparatus according to claim 3, wherein said for generating a magnetic means field produces a distribution of magnetic field strengths which monotonically decrease in the direction of propagation of said microwave.

5. A plasma treatment apparatus for treating an object, the apparatus comprising:
a vacuum vessel in which the object to be treated may be disposed, including a microwave introducing window introducing a microwave into said vessel, a reactive gas supplying tube flowing a reactive gas therethrough, and an exhaust port, means for generating a magnetic field provided outside of said vacuum vessel, an electron cyclotron resonance plane being defined by said magnetic field and a microwave introduced through said microwave introducing window,
said reactive gas being introduced to said electron cyclotron resonance plane,
wherein said reactive gas supplying tube is substantially coincident with said electron cyclotron resonance (ECR) plane such that a reactive gas concentration at the electron cyclotron resonance plane is higher than a reactive gas concentration near the microwave introducing window and is also higher than a reactive gas concentration on the substrate surface,
wherein an axial length of said vacuum vessel in the direction of propagation of said microwave is made smaller than a diameter of said vacuum vessel.

6. A plasma treatment apparatus for treating a object, the apparatus comprising;
a vacuum vessel in which the object to be treated may be disposed, including a microwave introducing window introducing a microwave into said vessel, a reactive gas supplying tube flowing a reactive gas therethrough, and an exhaust port, means for generating a magnetic field provided outside of said vacuum vessel, an electron cyclotron resonance plane being defined by said magnetic field and a microwave introduced through said microwave introducing window,
said reactive gas being introduced to said electron cyclotron resonance plane,
wherein said reactive gas supplying tube is substantially coincident with said electron cyclotron resonance (ECR) plane such that a reactive gas concentration at the electron cyclotron resonance plane is higher than a reactive gas concentration near the microwave introducing window and is also higher than a reactive gas concentration on the substrate surface,
wherein said means for generating a magnetic field includes at least two magnetic field generation coils distributed in the direction of propagation of said microwave, and said reactive gas supplying tube and said exhaust port are arranged between said two magnetic field coils.

7. A plasma treatment apparatus for treating an object, the apparatus comprising:
a vacuum vessel in which the object to be treated may be disposed, including a microwave introducing window introducing a microwave into said vessel, a reactive gas supplying tube flowing a reactive gas therethrough, and an exhaust port, means for generating a magnetic field provided outside of said vacuum vessel, an electron cyclotron resonance plane being defined by said magnetic field and a microwave introduced through said microwave introducing window,
said reactive gas being introduced to said electron cyclotron resonance plane,
wherein said reactive gas supplying tube is substantially coincident with said electron cyclotron resonance (ECR) plane such that a reactive gas concentration at the electron cyclotron resonance plane is higher than a reactive gas concentration near the microwave introducing window and is also higher than a reactive gas concentration on the substrate surface,
wherein said exhaust port is formed in a direction perpendicular to a surface of said substrate and at the same position as the position of the electron cyclotron resonance plane.

8. A plasma treatment apparatus comprising:
a vacuum vessel for accommodating therein an object to be treated;
a holder provided in said vacuum vessel for supporting said object;
main magnetic field generating means provided in said vacuum vessel for generating a main magnetic field which is fit to cause an electron cyclotron resonance on a surface of said object or in at least a part of the vicinity thereof;

means for introducing a microwave to the surface of said object or the vicinity thereof;

means for supplying a plasma gas into said vacuum vessel; and means for supplying a reactive gas to the surface of said object or the vicinity thereof;

wherein said means for supplying a reactive gas supplies said reactive gas coincident with said electron cyclotron resonance into the vacuum vessel.

9. A plasma treatment apparatus according to claim 8, wherein a magnetic shield plate is provided on a side of said main magnetic field generating means at which said microwave is introduced.

10. A plasma treatment apparatus according to claim 8, wherein said reactive gas is blown onto the surface of said object to enhance the concentration of the reactive gas at said surface.

11. A plasma treatment apparatus according to claim 9, wherein said reactive gas is blown onto the surface of said object to enhance the concentration of the reactive gas at said surface.

12. A plasma treatment apparatus according to claim 8, wherein said plasma gas supplying means also serves as said reactive gas supplying means.

13. A plasma treatment apparatus according to claim 9, wherein said plasma gas supplying means also serves as said reactive gas supplying means.

14. A plasma treatment apparatus according to claim 10, wherein said plasma gas supplying means also serves as said reactive gas supplying means.

15. A plasma treatment apparatus according to claim 11, wherein said plasma gas supplying means also serves as said reactive gas supplying means.

16. A plasma treatment apparatus according to claim 8, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

17. A plasma treatment apparatus according to claim 9, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

18. A plasma treatment apparatus according to claim 10, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

19. A plasma treatment apparatus according to claim 11, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

20. A plasma treatment apparatus according to claim 12, wherein a plurality of said reactive gas supplying means are provided along the surface of said object and said main magnetic field generating means generates the main magnetic field which is fi to cause the electron cyclotron resonance between said plurality of reactive gas supplying means and the surface of said object or the vicinity thereof.

21. A plasma treatment apparatus according to claim 14, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

22. A plasma treatment apparatus according to claim 15, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

23. A plasma treatment apparatus according to claim 16, wherein a plurality of said reactive gas supplying means are provided along the surface of said object and said main magnetic field generating means generates the main magnetic field which is fit to cause the electron cyclotron resonance between said plurality of reactive gas supplying means and the surface of said object or the vicinity thereof.

* * * * *